(12) United States Patent
Fukushima et al.

(10) Patent No.: US 12,507,341 B2
(45) Date of Patent: Dec. 23, 2025

(54) WIRING CIRCUIT BOARD AND PRODUCING METHOD THEREOF

(71) Applicant: NITTO DENKO CORPORATION, Osaka (JP)

(72) Inventors: Rihito Fukushima, Osaka (JP); Shusaku Shibata, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 53 days.

(21) Appl. No.: 17/775,789

(22) PCT Filed: Oct. 12, 2020

(86) PCT No.: PCT/JP2020/038485
§ 371 (c)(1),
(2) Date: May 10, 2022

(87) PCT Pub. No.: WO2021/095416
PCT Pub. Date: May 20, 2021

(65) Prior Publication Data
US 2022/0386458 A1 Dec. 1, 2022

(30) Foreign Application Priority Data

Nov. 12, 2019 (JP) ................................. 2019-204943

(51) Int. Cl.
*H05K 1/02* (2006.01)
(52) U.S. Cl.
CPC .................... *H05K 1/0296* (2013.01)
(58) Field of Classification Search
CPC ................................ H05K 1/02; H05K 1/0296
(Continued)

(56) References Cited

U.S. PATENT DOCUMENTS 10,187,984 B1 1/2019 Hou et al.
2003/0027417 A1 2/2003 Uda et al.
(Continued)

FOREIGN PATENT DOCUMENTS

CN 105657965 A 6/2016
CN 107112244 A 8/2017
(Continued)

OTHER PUBLICATIONS

International Search Report issued in PCT/JP2020/038485 on Dec. 15, 2020.
(Continued)

*Primary Examiner* — Tremesha W Burns
(74) *Attorney, Agent, or Firm* — Edwards Neils LLC; Jean C. Edwards, Esq.

(57) ABSTRACT

A wiring circuit board includes a base insulating layer, a first wiring layer disposed at one side in a thickness direction of the base insulating layer, and a cover insulating layer disposed on one surface in the thickness direction of the base insulating layer so as to cover the first wiring layer. The first wiring layer includes a first wiring portion in contact with one surface of the base insulating layer, and a second wiring portion in contact with one surface in the thickness direction of the first wiring portion. Both end surfaces in a width direction perpendicular to the thickness direction and a transmission direction of the second wiring portion are disposed inside in the width direction with respect to both end surfaces of the first wiring portion.

10 Claims, 8 Drawing Sheets

(58) Field of Classification Search
USPC .......................................................... 174/250
See application file for complete search history.

(56) References Cited

U.S. PATENT DOCUMENTS

| | | | |
|---|---|---|---|
| 2008/0142985 | A1 | 6/2008 | Fan |
| 2011/0116091 | A1* | 5/2011 | Shibayama ............... G01J 3/02 |
| | | | 356/334 |
| 2011/0155443 | A1 | 6/2011 | Maeda et al. |
| 2015/0245469 | A1 | 8/2015 | Hanazaki |
| 2016/0095215 | A1 | 3/2016 | Furutani |
| 2016/0157347 | A1 | 6/2016 | Roessler |
| 2016/0174374 | A1 | 6/2016 | Kong et al. |
| 2018/0288883 | A1* | 10/2018 | Sakakura ............. H05K 3/3494 |
| 2019/0098760 | A1 | 3/2019 | Murray et al. |
| 2020/0205284 | A1 | 6/2020 | Shin |
| 2021/0084750 | A1 | 3/2021 | Kawamura et al. |

FOREIGN PATENT DOCUMENTS

| | | | |
|---|---|---|---|
| JP | H06-291464 | A | 10/1994 |
| JP | H07-106757 | A | 4/1995 |
| JP | 109-219586 | A | 8/1997 |
| JP | 2000-124561 | A | 4/2000 |
| JP | 2000-323839 | A | 11/2000 |
| JP | 2003-133689 | A | 5/2003 |
| JP | 2006-310491 | A | 11/2006 |
| JP | 2010-067317 | A | 3/2010 |
| JP | 2011-119599 | A | 6/2011 |
| JP | 2011-138869 | A | 7/2011 |
| JP | 2012-155802 | A | 8/2012 |
| JP | 2013-065364 | A | 4/2013 |
| JP | 2014-143361 | A | 8/2014 |
| JP | 2015-050369 | A | 3/2015 |
| JP | 2016-066705 | A | 4/2016 |
| JP | 2017-063139 | A | 3/2017 |
| JP | 2019-054130 | A | 4/2019 |
| KR | 10-2019-0012873 | A | 2/2019 |
| TW | M550956 | U | 10/2017 |

OTHER PUBLICATIONS

Written Opinion issued in PCT/JP2020/038485 on Dec. 15, 2020.
International Preliminary Report on Patentability issued by WIPO on May 17, 2022, in connection with International Patent Application No. PCT/JP2020/038485.
Office Action, issued by the Japanese Patent Office on Jul. 18, 2023, in connection with Japanese Patent Application No. 2019-204943.
Office Action issued by the Taiwanese Patent Office on May 31, 2024, in connection with Taiwanese Patent Application No. 109135660.
Office Action issued by the Japanese Patent Office on Nov. 20, 2024, in connection with Japanese Patent Application No. 2024-005800.
Office Action issued by the Korean Patent Office on Jan. 23, 2025, in connection with Korean Patent Application No. 10-2022-7015156.
Office Action issued by the Vietnamese Patent Office on Jan. 13, 2025, in connection with Vietnamese Patent Application No. 1-2022-02969.
Office Action issued by the Japanese Patent Office on Apr. 8, 2025, in connection with Japanese Patent Application No. 2024-005800.
Office Action issued by the Japanese Patent Office on Aug. 26, 2025, in connection with Japanese Patent Application No. 2024-005800.
Office Action issued by the State Intellectual Property Office of the People's Republic of China on Apr. 25, 2025, in connection with Chinese Patent Application No. 202080077945.7.
Office Action issued by the Vietnam Intellectual Property Office on Sep. 8, 2025, in connection with Vietnamese Patent Application No. 1-2022-02969.

* cited by examiner

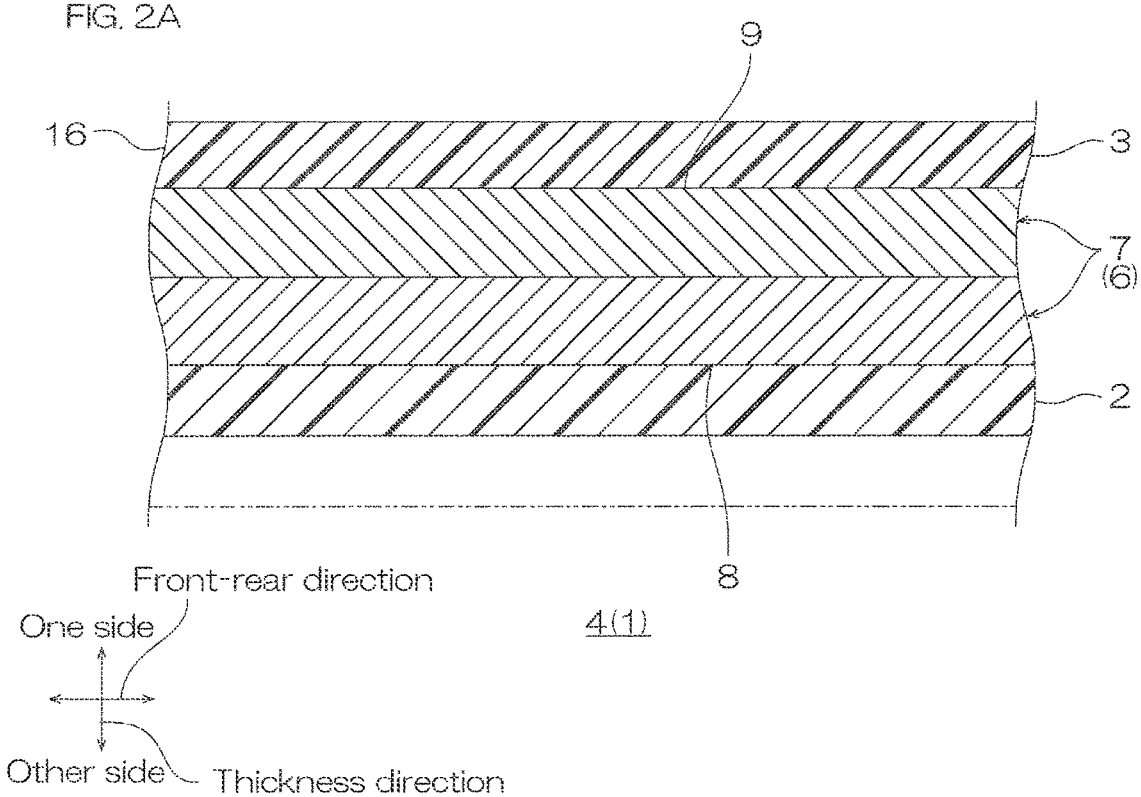
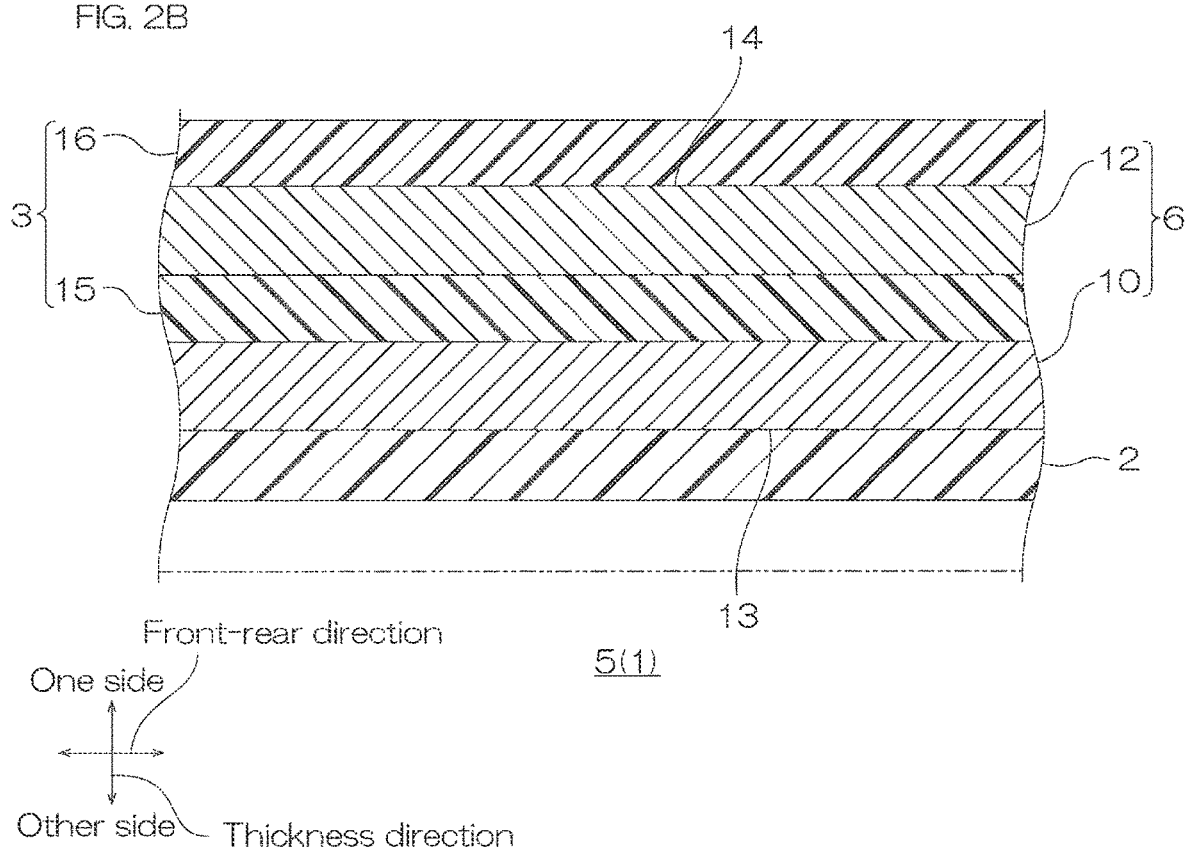

FIG. 10
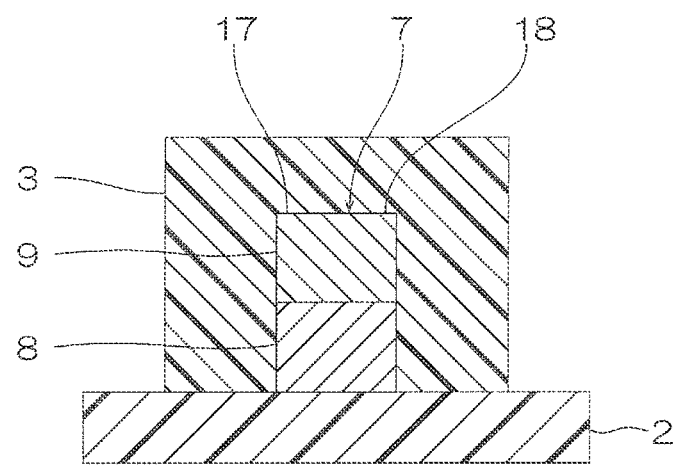
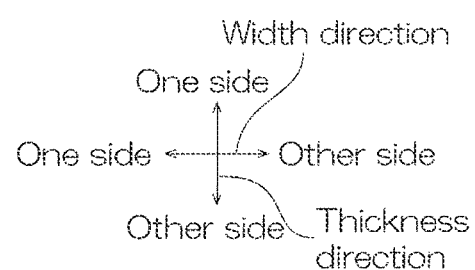

WIRING CIRCUIT BOARD AND PRODUCING METHOD THEREOF

CROSS-REFERENCE TO RELATED APPLICATIONS

The present application is a 35 U.S.C. 371 National Stage Entry of: PCT/JP2020/038485, filed on Oct. 12, 2020, which claims priority from Japanese Patent Application No. 2019-204943, filed on Nov. 12, 2019, the contents of all of which are herein incorporated by reference in their entirety.

TECHNICAL FIELD

The present invention relates to a wiring circuit board, and a method for producing a wiring circuit board.

BACKGROUND ART

Conventionally, a wiring circuit board including a base insulating layer, a wiring layer formed thereon and having a rectangular shape in a cross section, and a cover insulating layer covering the wiring layer has been known (ref: for example, Patent Document 1 below).

CITATION LIST

Patent Document

Patent Document 1: Japanese Unexamined Patent Publication No. 2011-119599

SUMMARY OF THE INVENTION

Problem to be Solved by the Invention

Recently, the wiring circuit board is required to efficiently transmit a large current to the wiring layer.

Therefore, it has been considered that by widening a width of the wiring layer, or by thickening a thickness of the wiring layer, the area in a cross section is increased to reduce electrical resistance of the wiring layer. In view of a case where the width of the wiring layer may not be widened when the installation space of the wiring layer is limited, a method for thickening the thickness of the wiring layer is especially considered.

However, in this case, there is a problem that the cover insulating layer is easily peeled off from both ends in a width direction at the upper end of the wiring.

The present invention provides a wiring circuit board capable of suppressing peeling of a cover insulating layer from a wiring layer, while reducing electrical resistance in the wiring layer, and a method for producing a wiring circuit board.

Means for Solving the Problem

The present invention (1) includes a wiring circuit board including a base insulating layer, a wiring layer disposed at one side in a thickness direction of the base insulating layer, and a cover insulating layer disposed on one surface in the thickness direction of the base insulating layer so as to cover the wiring layer, wherein the wiring layer includes a first wiring portion in contact with one surface of the base insulating layer, and a second wiring portion in contact with one surface in the thickness direction of the first wiring portion, and both end surfaces in a width direction perpendicular to the thickness direction and a transmission direction of the second wiring portion are disposed inside in the width direction with respect to both end surfaces of the first wiring portion.

In the wiring circuit board, the wiring layer includes the first wiring portion and the second wiring portion. Therefore, by increasing the area in a cross section, it is possible to reduce electrical resistance of the wiring layer.

Further, both end surfaces in the width direction of the second wiring portion are disposed inside in the width direction with respect to both end surfaces of the first wiring portion. Therefore, in each of both end portions in the width direction of the wiring layer, it is possible to form two steps from the first wiring portion and the second wiring portion. Therefore, it is possible to suppress peeling of the cover insulating layer from the wiring layer by an anchor effect covering these steps.

The present invention (2) includes the wiring circuit board described in (1), wherein a ratio (T2/T1) of a thickness T2 of the second wiring portion to a thickness T1 of the first wiring portion is 0.7 or more and 3.0 or less.

In the wiring circuit board, since the ratio (T2/T1) of the thickness T2 of the second wiring portion to the thickness T1 of the first wiring portion is 0.7 or more and 3.0 or less, it is possible to reliably achieve the anchor effect and more reliably suppress the peeling of the cover insulating layer from the wiring layer, while increasing the area in a cross section of the wiring layer.

The present invention (3) includes the wiring circuit board described in (1) or (2), wherein the wiring layer further includes a third wiring portion in contact with one surface in the thickness direction of the base insulating layer, and a fourth wiring portion spaced apart from the third wiring portion at one side in the thickness direction.

In the wiring circuit board, since the wiring layer includes the third wiring portion and the fourth wiring portion, the third wiring portion and the fourth wiring portion can be used for the same application as or for different application from the first wiring portion and the second wiring portion. Therefore, the wiring layer can be used for a wide range of applications.

The present invention (4) includes the wiring circuit board described in (3), wherein the wiring layer includes a first pattern portion including the first wiring portion and the second wiring portion, and a second pattern portion including the third wiring portion and the fourth wiring portion, and independent of the first pattern portion.

In the wiring circuit board, since the wiring layer includes a first pattern, and a second pattern independent thereof, it is possible to use each of these patterns for each application.

The present invention (5) includes a method for producing the wiring circuit board described in (4); the method including a step of forming a base insulating layer, a step of forming a first wiring portion and a third wiring portion, a step of simultaneously forming a second wiring portion and a fourth wiring portion, and a step of forming a cover insulating layer.

In the method, since the second wiring portion included in the first pattern portion, and the fourth wiring portion included in the second pattern portion are simultaneously formed, it is possible to easily form the second wiring portion and the fourth wiring portion included in pattern portions different from each other at one time.

Effect of the Invention

According to the wiring circuit board of the present invention, it is possible to suppress peeling of a cover insulating layer from a wiring layer, while reducing electrical resistance of the wiring layer.

According to the method for producing a wiring circuit board of the present invention, it is possible to easily form a second wiring portion and a fourth wiring portion included in pattern portions different from each other at one time.

BRIEF DESCRIPTION OF THE DRAWINGS

FIG. 1A illustrating a plan view and

FIG. 1B illustrating a front cross-sectional view along an X-X line of FIG. 1A.

FIGS. 2A to 2B show side cross-sectional views of the wiring circuit board shown in FIGS. 1A to 1B:

FIG. 2A illustrating a cross-sectional view along a Y-Y line of FIGS. 1A to 1B and FIG. 2B illustrating a cross-sectional view along a Z-Z line of FIGS. 1A to 1B.

FIG. 3A illustrating a step of preparing a base insulating layer,

FIG. 3B illustrating a step of forming a first wiring portion and a third wiring portion, FIG. 3C illustrating a step of forming a first cover insulating layer, FIG. 3D illustrating a step of forming a second wiring portion and a fourth wiring portion, and FIG. 3E illustrating a step of forming a second cover insulating layer.

FIG. 8A illustrating a plan view and

FIG. 8B illustrating a side cross-sectional view along a Z-Z line of FIG. 8A.

FIG. 9A illustrating a step of forming a first wiring portion,

FIG. 9B illustrating a step of forming a second wiring portion and a third wiring portion, FIG. 9C illustrating a step of forming a first cover insulating layer, FIG. 9D illustrating a step of forming a fourth wiring portion, and FIG. 9E illustrating a step of forming a second cover insulating layer.

FIG. 10 shows a cross-sectional view of a wiring circuit board of Comparative Example 1.

DESCRIPTION OF EMBODIMENTS

One Embodiment

Figure 1A:
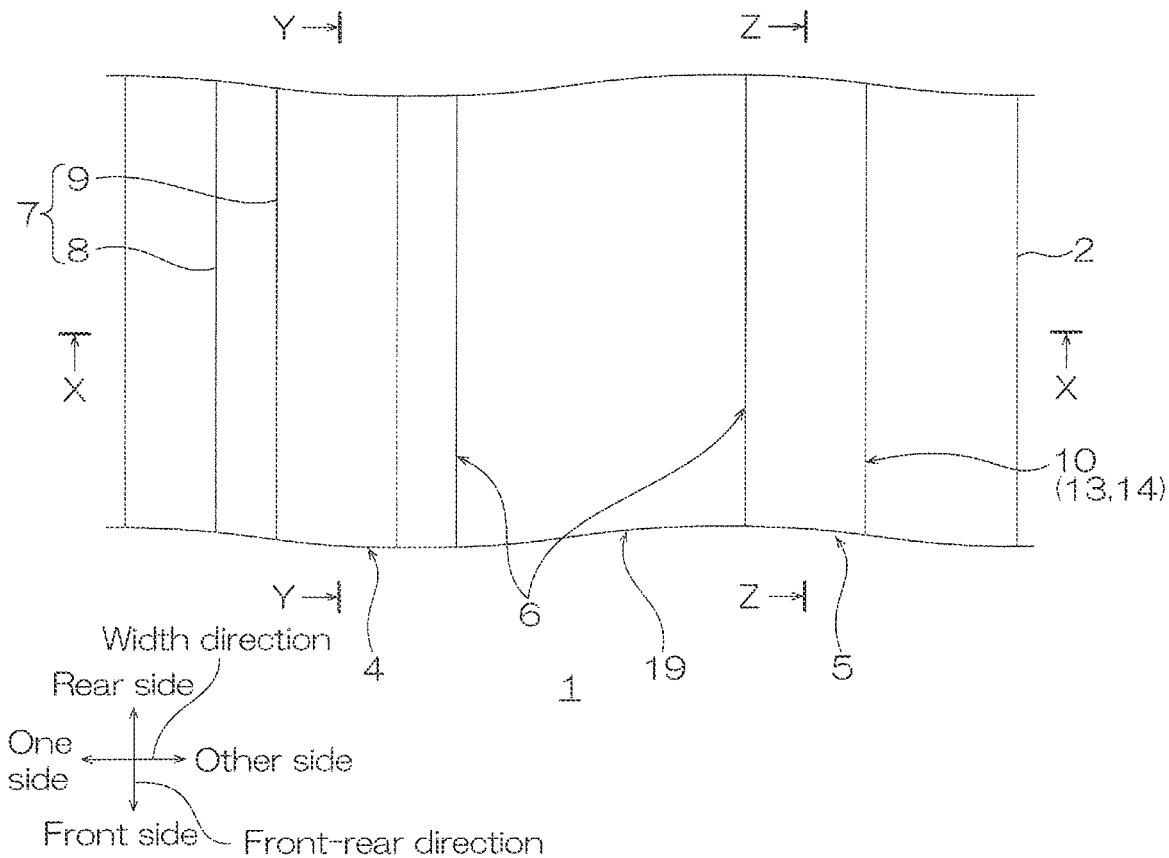
FIGS. 1A to 1B show enlarged views of one embodiment of a wiring circuit board of the present invention.

One embodiment of a wiring circuit board of the present invention is described with reference to FIGS. 1A to 2B. In FIG. 1A, a cover insulating layer 3 (described later) is omitted in order to clearly show the relative arrangement of a wiring layer 6 (described later).

Figure 1B:
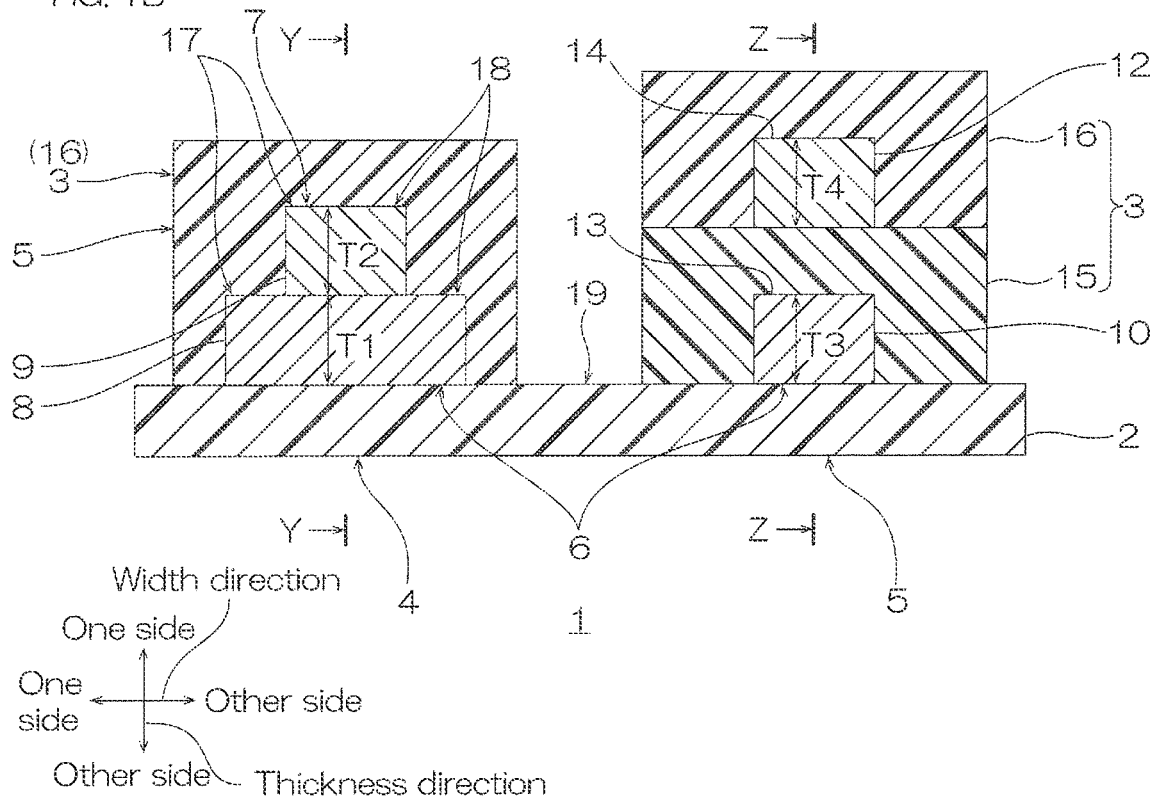

A wiring circuit board 1 has a predetermined thickness, and has a flat belt shape extending long in a front-rear direction (up-down direction on the plane of the sheet in FIG. 1A, depth direction on the plane of the sheet in FIG. 1B). The wiring circuit board 1 includes a base insulating layer 2, the wiring layer 6 disposed at one side in a thickness direction of the base insulating layer 2, and the cover insulating layer 3 covering the wiring layer 6.

The base insulating layer 2 has the same outer shape as the wiring circuit board 1 when viewed from the top. Examples of a material for the base insulating layer 2 include insulating resins such as polyimide. The base insulating layer 2 has a thickness of, for example, 5 μm or more, and for example, 30 μm or less.

The wiring layer 6 includes a first wiring layer 7, a second wiring layer 10, and a third wiring layer 12. Examples of a material for the wiring layer 6 include conductors such as copper. The wiring layer 6 extends in the front-rear direction. That is, a direction in which the wiring layer 6 extends is a transmission direction and also the front-rear direction. A shape, an arrangement, and a dimension of the wiring layer 6 are described in detail later.

The cover insulating layer 3 is disposed on one surface in the thickness direction of the base insulating layer 2. The cover insulating layer 3 covers the wiring layer 6. Examples of a material for the cover insulating layer 3 include insulating resins such as polyimide.

Further, the wiring circuit board 1 includes a first pattern portion 4 and a second pattern portion 5. The first pattern portion 4 is a one-side portion in a width direction (direction perpendicular to the thickness direction and the front-rear direction) in the wiring circuit board 1, and the second pattern portion 5 is an other-side portion in the width direction in the wiring circuit board 1. The first pattern portion 4 and the second pattern portion 5 are spaced apart from each other in the width direction. A margin portion 19 is provided between the first pattern portion 4 and the second pattern portion 5. The margin portion 19 includes only the base insulating layer 2 without including the cover insulating layer 3 and the wiring layer 6 (described later).

As shown by a left-side view of FIG. 1B, and FIG. 2A, the first pattern portion 4 includes the base insulating layer 2, the first wiring layer 7, and the cover insulating layer 3.

The first wiring layer 7 is, for example, a power supply wiring for transmitting a power supply current (large current of, for example, 10 mA or more, furthermore 100 mA or more). The first wiring layer 7 is one example of a first pattern.

The first wiring layer 7 has a generally rectangular shape extending along the front-rear direction when viewed from the top. Or, the first wiring layer 7 has a generally protruded shape (inverted T-shape) in a cross section perpendicular to the transmission direction of the first wiring layer 7.

As shown in FIG. 1B, the first wiring layer 7 includes a first wiring portion 8, and a second wiring portion 9 which is narrower than that in order toward one side in the thickness direction. Preferably, the first wiring layer 7 includes only the first wiring portion 8 and the second wiring portion 9.

The first wiring portion 8 is the other portion in the thickness direction in the first wiring layer 7. The first wiring portion 8 is disposed on one surface in the thickness direction of the base insulating layer 2. The first wiring portion 8 has a generally rectangular shape which is long in the width direction. The entire other surface in the thickness direction of the first wiring portion 8 is in contact with one surface in the thickness direction of the base insulating layer 2.

The second wiring portion 9 is one portion in the thickness direction in the first wiring layer 7. The second wiring portion 9 is disposed in an intermediate portion (portion between both end portions) in the width direction of one surface in the thickness direction of the first wiring portion 8. The second wiring portion 9 has a generally rectangular shape in a cross section perpendicular to the transmission direction of the first wiring layer 7. The entire other surface in the thickness direction of the second wiring portion 9 is not in contact with both end portions in the width direction of one surface in the thickness direction in the first wiring portion 8, and is in contact with the intermediate portion in the width direction of one surface in the thickness direction.

Thus, in the first wiring layer 7, both end surfaces in the width direction of the second wiring portion 9 are disposed inside in the width direction with respect to both end surfaces of the first wiring portion 8.

In one end portion in the width direction of the first wiring layer 7, two one-side steps 17 consisting of the side end surfaces and one surface in the thickness direction of the first wiring portion 8, and the side end surfaces and one surface in the thickness direction of the second wiring portion 9 are formed. Further, in the other end portion in the width direction of the first wiring layer 7, two other-side steps 18 consisting of the side end surfaces and one surface in the thickness direction of the first wiring portion 8, and the side end surfaces and one surface in the thickness direction of the second wiring portion 9 are formed.

The first wiring portion 8 and the second wiring portion 9 described above constitute the first pattern.

The first wiring portion 8 has a thickness T1 of, for example, 3 μm or more, preferably 5 μm or more, and for example, 40 μm or less, preferably 25 μm or less. The second wiring portion 9 has a thickness T2 of, for example, 3 μm or more, preferably 5 μm or more, and for example, 50 μm or less, preferably 30 μm or less. A ratio (T2/T1) of the thickness T2 of the second wiring portion 9 to the thickness T1 of the first wiring portion 8 is, for example, 0.7 or more, preferably 0.9 or more, more preferably 1.0 or more, and for example, 3.0 or less, preferably 2.0 or less, more preferably 1.5 or less. The thickness T1 of the first wiring portion 8 is a length between one surface in the thickness direction of the first wiring portion 8 and one surface in the thickness direction of the base insulating layer 2. The thickness T2 of the second wiring portion 9 is a length between one surface in the thickness direction of the second wiring portion 9 and one surface in the thickness direction of the first wiring portion 8. When the ratio is within the above-described range, it is possible to reliably achieve an anchor effect of the cover insulating layer 3 (second cover insulating layer 16) with respect to the first wiring layer 7, and more reliably suppress peeling of the cover insulating layer 3 from the first wiring layer 7, while increasing the area in a cross section of the first wiring layer 7.

The first wiring portion 8 has a width of, for example, 10 μm or more, preferably 20 μm or more, more preferably 30 μm or more, and for example, 500 μm or less, preferably 250 μm or less. The width of the first wiring portion 8 is a distance between both end surfaces in the width direction of the first wiring portion 8. When the width of the first wiring portion 8 is the above-described upper limit or less, it is possible to dispose the first wiring layer 7 even in a narrow space. The second wiring portion 9 has a width of, for example, 5 μm or more, preferably 15 μm or more, more preferably 20 μm or more, and for example, 450 μm or less, preferably 200 μm or less. The width of the second wiring portion 9 is a distance between both end surfaces in the width direction of the second wiring portion 9. A ratio of the width of the second wiring portion 9 to the width of the first wiring portion 8 is, for example, 0.8 or less, preferably 0.6 or less, and for example, 0.1 or more, preferably 0.3 or more.

The thickness of the first wiring layer 7 is the total sum of the thickness T1 of the first wiring portion 8 and the thickness T2 of the second wiring portion 9. The width of the first wiring layer 7 is the same as the width of the first wiring portion 8.

A terminal which is not shown is connected to both ends in the front-rear direction of the first wiring layer 7. The terminal is electrically connected to an electrode. The electrode is provided in a power supply device for inputting a power supply current to the first wiring layer 7, and a driving device for taking out the power supply current from the first wiring layer 7.

As shown in FIGS. 1B and 2A, in the first pattern portion 4, the cover insulating layer 3 includes the second cover insulating layer 16. Specifically, in this embodiment, the cover insulating layer 3 includes only the second cover insulating layer 16.

As shown by the left-side view of FIG. 1B, the second cover insulating layer 16 covers the first wiring layer 7. Specifically, the second cover insulating layer 16 is in contact with an outer vicinity portion of the first wiring portion 8 on one surface in the thickness direction of the base insulating layer 2, both end surfaces in the width direction and one surface in the thickness direction of the first wiring portion 8, and both end surfaces in the width direction and one surface in the thickness direction of the second wiring portion 9. More specifically, the second cover insulating layer 16 is in contact (in tight contact) with the two one-side steps 17 and the two other-side steps 18 of the first wiring layer 7. The second cover insulating layer 16 is fixed to each of both end portions in the width direction of the first wiring layer 7.

A length between one surface in the thickness direction of the second cover insulating layer 16 and one surface in the thickness direction of the second wiring portion 9 corresponds to the thickness of the second cover insulating layer 16. The second cover insulating layer 16 has a thickness of, for example, 5 μm or more, and for example, 50 μm or less.

As shown by a right-side view of FIG. 1B, and FIG. 2B, the second pattern portion 5 includes the base insulating layer 2, the second wiring layer 10, a first cover insulating layer 15, the third wiring layer 12, and the second cover insulating layer 16.

The base insulating layer 2 in the second pattern portion 5 is the same layer as the base insulating layer 2 in the first pattern portion 4.

The second wiring layer 10 is, for example, a signal wiring for transmitting an electrical signal (weak current of, for example, below 10 mA, furthermore below 1 mA). The second wiring layer 10 includes a third wiring portion 13 having a generally rectangular shape. Preferably, the second wiring layer 10 includes only the third wiring portion 13.

The third wiring portion 13 is disposed on one surface in the thickness direction of the base insulating layer 2. The entire other surface in the thickness direction of the third wiring portion 13 is in contact with one surface in the thickness direction of the base insulating layer 2. A thickness T3 of the third wiring portion 13 is, for example, the same as the thickness T1 of the first wiring portion 8. A width of the third wiring portion 13 is not particularly limited, and in this embodiment, for example, is the same as the width of the second wiring portion 9. Then, in this embodiment, the width of the third wiring portion 13 is narrower than the width of the first wiring portion 8.

The first cover insulating layer 15 covers the third wiring portion 13 in a cross section perpendicular to the transmission direction of the first wiring layer 7. Specifically, the first cover insulating layer 15 is in contact with the outer vicinity portion of the third wiring portion 13 on one surface in the thickness direction of the base insulating layer 2, and both end surfaces in the width direction and one surface in the thickness direction of the third wiring portion 13. A length between one surface in the thickness direction of the first cover insulating layer 15 and one surface in the thickness direction of the third wiring portion 13 corresponds to the thickness of the first cover insulating layer 15. The first cover insulating layer 15 has a thickness of, for example, 5 µm or more, and for example, 50 µm or less.

The third wiring layer 12 is, for example, a signal wiring for transmitting an electrical signal (weak current of, for example, below 10 mA, furthermore below 1 mA). The third wiring layer 12 includes a fourth wiring portion 14 having a generally rectangular shape. Preferably, the third wiring layer 12 includes only the fourth wiring portion 14.

The fourth wiring portion 14 is disposed on one surface in the thickness direction of the first cover insulating layer 15. The entire other surface in the thickness direction of the fourth wiring portion 14 is in contact with one surface in the thickness direction of the first cover insulating layer 15. The fourth wiring portion 14 is overlapped with the third wiring portion 13 when projected in the thickness direction. Specifically, a shape of the fourth wiring portion 14 when viewed from the top matches the shape of the third wiring portion 13 when viewed from the top. A thickness T4 of the fourth wiring portion 14 is, for example, the same as the thickness T3 of the third wiring portion 13. The width of the fourth wiring portion 14 is the same as the width of the third wiring portion 13.

The second wiring layer 10 and the third wiring layer 12 described above are one example of a second pattern. The third wiring portion 13 and the fourth wiring portion 14 constitute the second pattern.

The second cover insulating layer 16 covers the fourth wiring portion 14. Specifically, the second cover insulating layer 16 is in contact with the outer vicinity portion of the fourth wiring portion 14 on one surface in the thickness direction of the first cover insulating layer 15, and both end surfaces in the width direction and one surface in the thickness direction of the fourth wiring portion 14. A length between one surface in the thickness direction of the second cover insulating layer 16 and one surface in the thickness direction of the fourth wiring portion 14 corresponds to the thickness of the second cover insulating layer 16. The second cover insulating layer 16 has a thickness of, for example, 5 µm or more, and for example, 50 µm or less.

The first cover insulating layer 15 and the second cover insulating layer 16 described above are provided in the cover insulating layer 3. Preferably, the cover insulating layer 3 in the second pattern portion 5 includes only the first cover insulating layer 15 and the second cover insulating layer 16.

Next, a method for producing the wiring circuit board 1 is described with reference to FIGS. 3A to 3E. The method for producing the wiring circuit board 1 includes a first step of preparing the base insulating layer 2, a second step of forming the first wiring portion 8 and the third wiring portion 13, a third step of forming the first cover insulating layer 15, a fourth step of forming the second wiring portion 9 and the fourth wiring portion 14, and a fifth step of forming the second cover insulating layer 16. The first step to the fifth step are carried out in order.

Figure 3A:
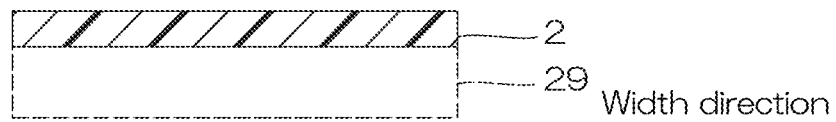
FIGS. 3A to 3E show production process views of the wiring circuit board shown in FIG. 1B.

As shown in FIG. 3A, in the first step, for example, a photosensitive insulating resin composition is subjected to photolithography to form the base insulating layer 2.

Figure 3B:
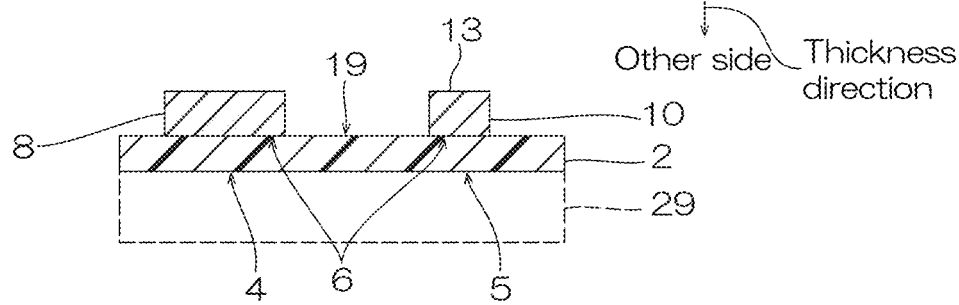

As shown in FIG. 3B, in the second step, the first wiring portion 8 and the third wiring portion 13 are simultaneously formed by, for example, a pattern forming method such as additive method and subtractive method. In the second pattern portion 5, the second wiring layer 10 (signal wiring) including the third wiring portion 13 is formed.

Figure 3C:
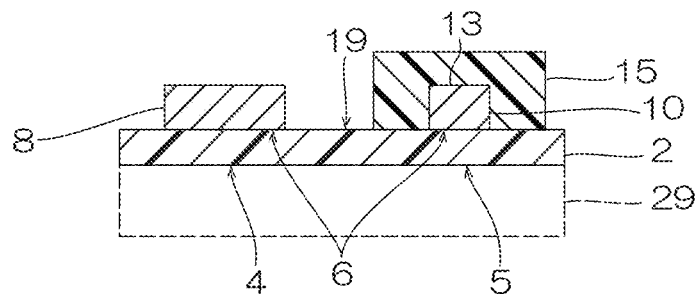

As shown in FIG. 3C, in the third step, for example, the photosensitive insulating resin composition is applied to one surface in the thickness direction of the base insulating layer 2 so as to cover the first wiring portion 8 and the third wiring portion 13 to be then subjected to photolithography. Thus, the first cover insulating layer 15 covering the third wiring portion 13 is formed in the second pattern portion 5.

Figure 3D:
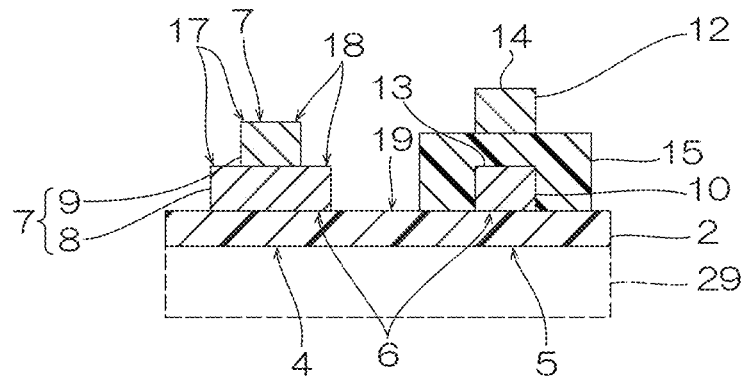

As shown in FIG. 3D, in the fourth step, the second wiring portion 9 and the fourth wiring portion 14 are simultaneously formed by, for example, a pattern forming method such as additive method and subtractive method. Thus, in the first pattern portion 4, the first wiring layer 7 (power supply wiring) including the first wiring portion 8 and the second wiring portion 9 is formed. Further, in the second pattern portion 5, the third wiring layer 12 (signal wiring) including the fourth wiring portion 14 is formed.

Figure 3E:
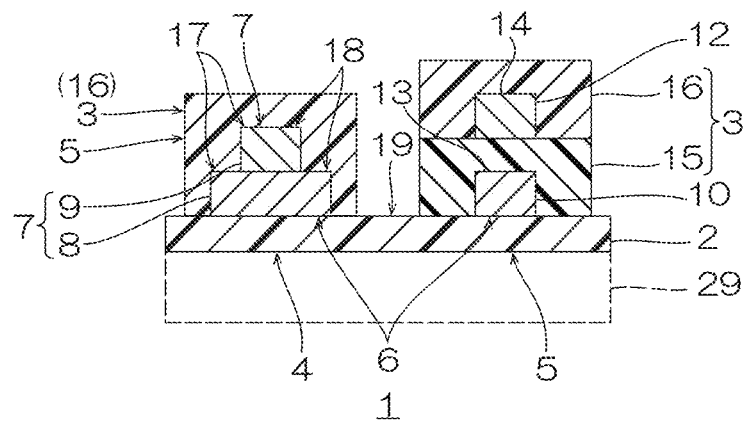

As shown in FIG. 3E, in the fifth step, for example, the photosensitive insulating resin composition is applied to one surface in the thickness direction of the base insulating layer 2 and the first cover insulating layer 15 so as to cover the second wiring portion 9 and the fourth wiring portion 14 to be then subjected to photolithography. Thus, the second cover insulating layer 16 is formed in both the first pattern portion 4 and the second pattern portion 5. Thus, in the first pattern portion 4, the cover insulating layer 3 including the second cover insulating layer 16 is formed. In the second pattern portion 5, the cover insulating layer 3 including the first cover insulating layer 15 and the second cover insulating layer 16 is formed.

(Function and Effect of One Embodiment)

Then, in the wiring circuit board 1, the first wiring layer 7 of the wiring layer 6 includes the first wiring portion 8 and the second wiring portion 9. Therefore, by increasing the area in a cross section, it is possible to reduce electrical resistance of the first wiring layer 7.

Further, both end surfaces in the width direction of the second wiring portion 9 are disposed inside in the width direction with respect to both end surfaces of the first wiring portion 8. Therefore, in one end portion in the width direction of the first wiring layer 7, it is possible to form the two one-side steps 17 from the first wiring portion 8 and the second wiring portion 9. In the other end portion in the width direction of the first wiring layer 7, it is possible to form the two other-side steps 18 from the first wiring portion 8 and the second wiring portion 9. Therefore, it is possible to suppress the peeling of the cover insulating layer 3 from the first wiring layer 7 by the anchor effect covering these steps.

On the other hand, as in Comparative Example 1 shown in FIG. 10, when both end surfaces in the width direction of the second wiring portion 9 are at the same position as both end surfaces of the first wiring portion 8, and each of the one-side step 17 and the other-side step 18 is one, the anchor effect of the cover insulating layer 3 with respect to the first wiring layer 7 is significantly reduced. Therefore, it is not possible to sufficiently suppress the peeling of the cover insulating layer 3 from the first wiring layer 7.

Further, in the wiring circuit board 1 of one embodiment, when the ratio (T2/T1) of the thickness T2 of the second wiring portion 9 to the thickness T1 of the first wiring portion 8 is 0.9 or more and 2.0 or less, it is possible to reliably achieve the anchor effect and more reliably suppress the peeling of the cover insulating layer 3 from the first wiring layer 7, while increasing the area in a cross section of the first wiring layer 7.

Furthermore, in the wiring circuit board 1, the second wiring layer 10 and the third wiring layer 12 of the wiring layer 6 include the third wiring portion 13 and the fourth wiring portion 14, respectively. Therefore, the second wiring layer 10 including the third wiring portion 13, and the third wiring layer 12 including the fourth wiring portion 14 can be used for different applications from the first wiring portion 8 and the second wiring portion 9, specifically, for signal wirings. Therefore, the wiring layer 6 can be used for a wide range of applications.

Furthermore, in the wiring circuit board 1, since the wiring layer 6 includes the first wiring layer 7 (the first pattern), and the second wiring layer 10 and the third wiring layer 12 which are independent thereof (the second pattern), for example, the first wiring layer 7 can be used as a power supply wiring, and the second wiring layer 10 and the third wiring layer 12 can be used as signal wirings.

Further, in this method, as shown in FIG. 3D, since the second wiring portion 9 included in the first wiring layer 7, and the fourth wiring portion 14 included in the third wiring layer 12 are simultaneously formed, it is possible to easily form the second wiring portion 9 and the fourth wiring portion 14 included in patterns different from each other at one time.

(Modified Examples)

In each modified example below, the same reference numerals are provided for members and steps corresponding to each of those in the above-described one embodiment, and their detailed description is omitted. Each modified example can achieve the same function and effect as that of one embodiment unless otherwise specified. Furthermore, one embodiment and the modified example thereof can be appropriately used in combination.

As shown in FIGS. 4 to 7, the margin portion 19 may also include the cover insulating layer 3. In the modified example, the cover insulating layer 3 in the margin portion 19 is the first cover insulating layer 15. The first cover insulating layer 15 in the margin portion 19 connects the first cover insulating layer 15 of the first pattern portion 4 to the first cover insulating layer 15 of the second pattern portion 5 in the width direction.

Figure 4:
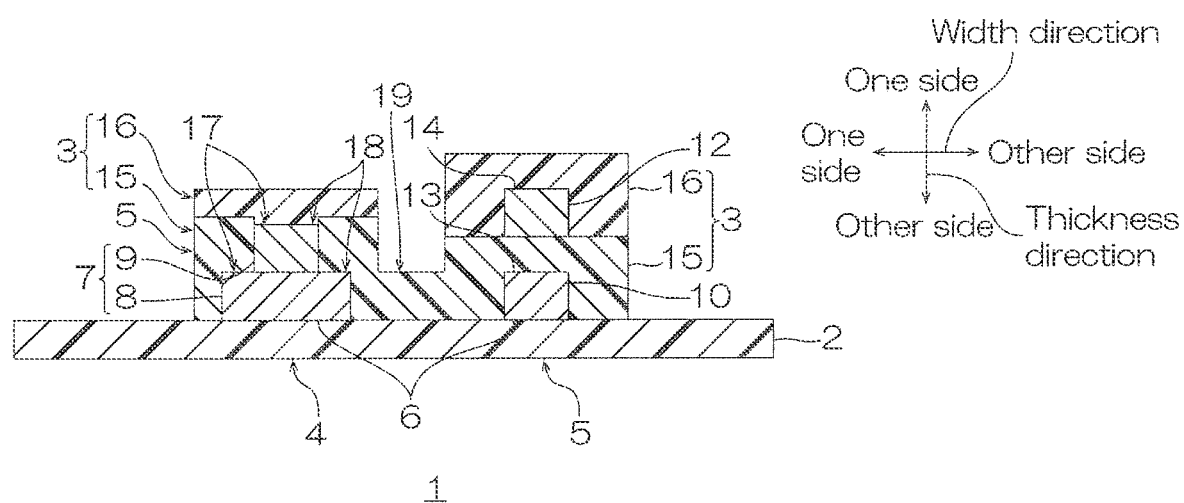
FIG. 4 shows a cross-sectional view of a modified example (embodiment in which a first pattern portion has a second cover insulating layer) of the wiring circuit board shown in FIG. 1B.

As shown in FIG. 4, in the first pattern portion 4, the cover insulating layer 3 further includes the first cover insulating layer 15. That is, in the first pattern portion 4, the cover insulating layer 3 includes the first cover insulating layer 15 and the second cover insulating layer 16.

The first cover insulating layer 15 is in contact with the outer vicinity portion of the first wiring portion 8 on one surface in the thickness direction of the base insulating layer 2, and both end surfaces in the width direction of the first wiring portion 8.

The second cover insulating layer 16 is in contact with one surface in the thickness direction of the second wiring portion 9.

Figure 5:
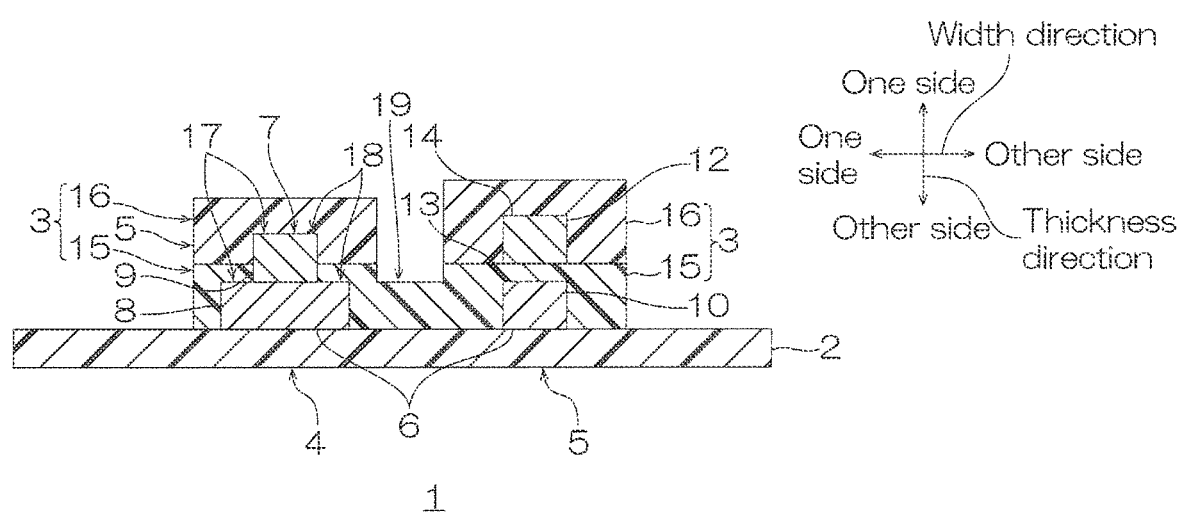
FIG. 5 shows a cross-sectional view of a modified example (embodiment in which a second cover insulating layer is in contact with a portion of a side surface of a second wiring portion) of the wiring circuit board shown in FIG. 1B.

As shown in FIG. 5, the second cover insulating layer 16 is in contact with the one-side portion in the thickness direction on both end surfaces in the width direction of the second wiring portion 9. On the other hand, the first cover insulating layer 15 is in contact with the other-side portion in the thickness direction on both end surfaces in the width direction of the second wiring portion 9.

Figure 6:
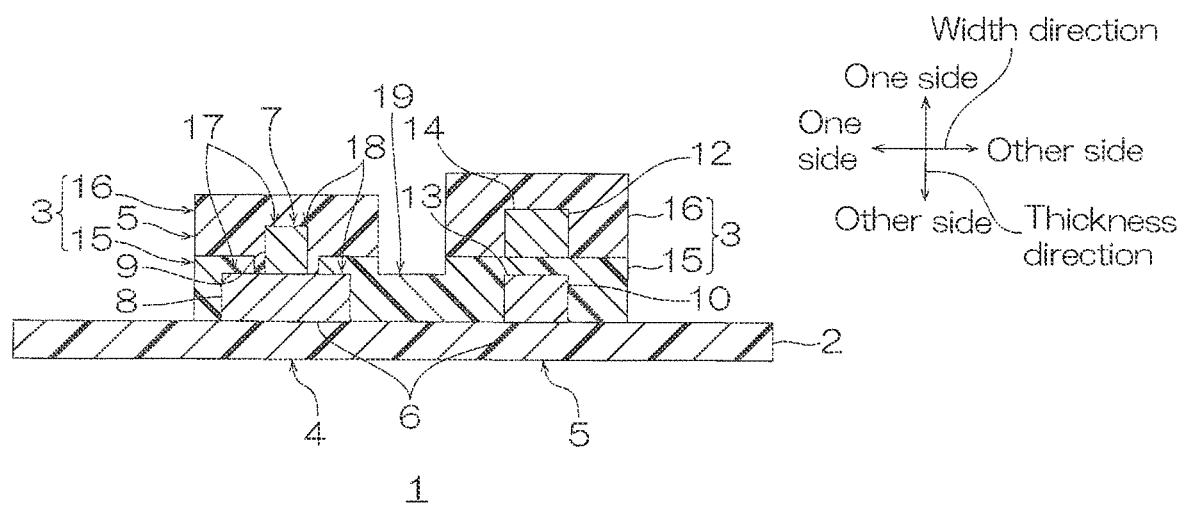
FIG. 6 shows a cross-sectional view of a modified example (embodiment in which a second cover insulating layer is in contact with a portion of one surface in a thickness direction of a first wiring portion) of the wiring circuit board shown in FIG. 1B.

As shown in FIG. 6, the second cover insulating layer 16 is in contact with the entire both end surfaces in the width direction of the second wiring portion 9, and the outer vicinity portion of the second wiring portion 9 on one surface in the thickness direction of the first wiring portion 8. On the other hand, the first cover insulating layer 15 is in contact with both end portions in the width direction on one surface in the thickness direction of the first wiring portion 8.

Figure 7:
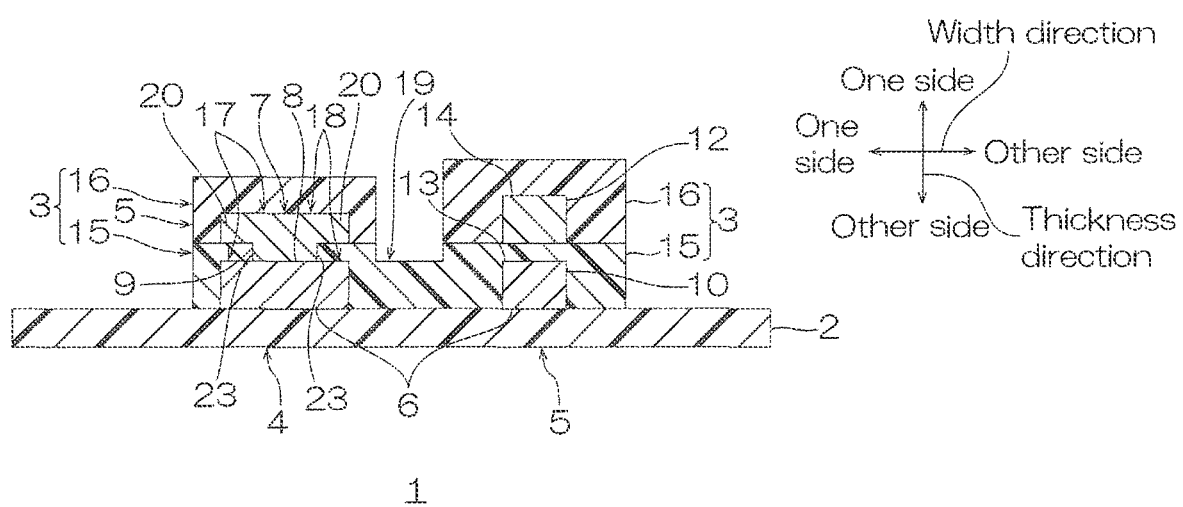
FIG. 7 shows a cross-sectional view of a modified example (embodiment in which an eaves portion is continuous with a second wiring portion) of the wiring circuit board shown in FIG. 1B.

As shown in FIG. 7, an eaves portion 20 may be continuous with the one-side portion in the thickness direction of both end surfaces in the width direction of the second wiring portion 9. The eaves portion 20 protrudes from the one-side portion in the thickness direction of both end surfaces in the width direction of the second wiring portion 9 toward both outer sides in the width direction. A length between the end surface of the eaves portion 20 at one side in the width direction and the end surface of the eaves portion 20 at the other side in the width direction is, for example, the same as the width of the first wiring portion 8. In the modified example, a groove portion 23 is formed between the eaves portion 20 and the end portion in the width direction of the first wiring portion 8. The other-side portions in the thickness direction of both end surfaces in the width direction of the second wiring portion 9 are disposed inside in the width direction with respect to both end surfaces in the width direction of the first wiring portion 8, and form the groove portion 23 along with the eaves portion 20 and both end portions of the first wiring portion 8. The first cover insulating layer 15 fills the groove portion 23. Therefore, the cover insulating layer 3 can achieve the anchor effect based on the groove portion 23.

Figure 8A:
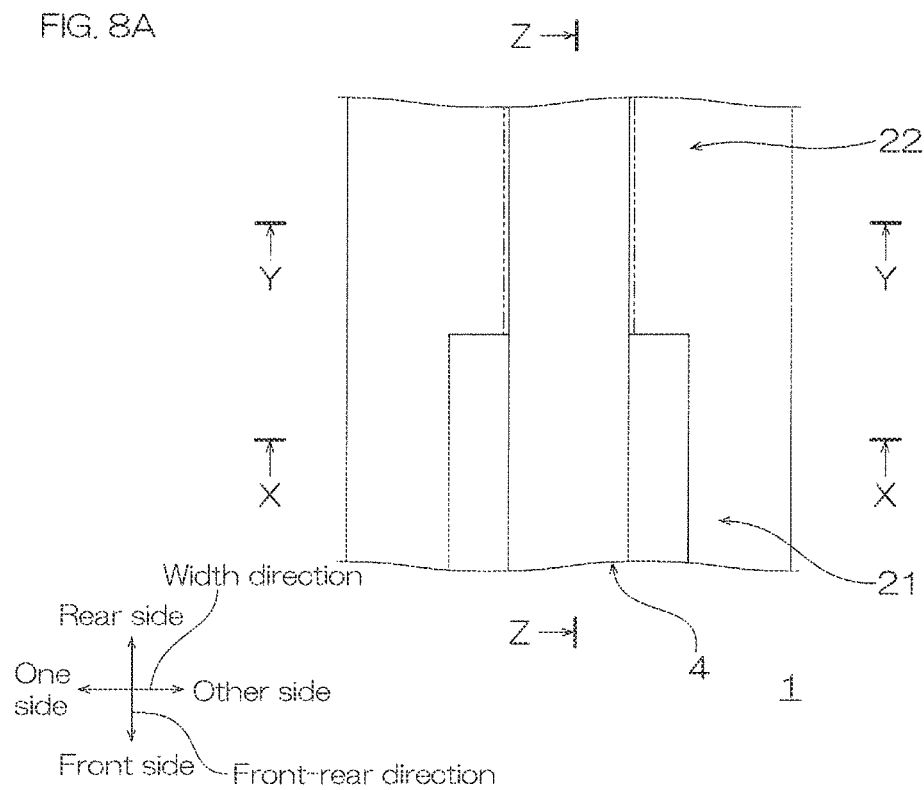
FIGS. 8A to 8B show a modified example (embodiment including a first pattern portion without including a second pattern portion) of the wiring circuit board shown in FIGS. 1A to 1B.
Figure 8B:
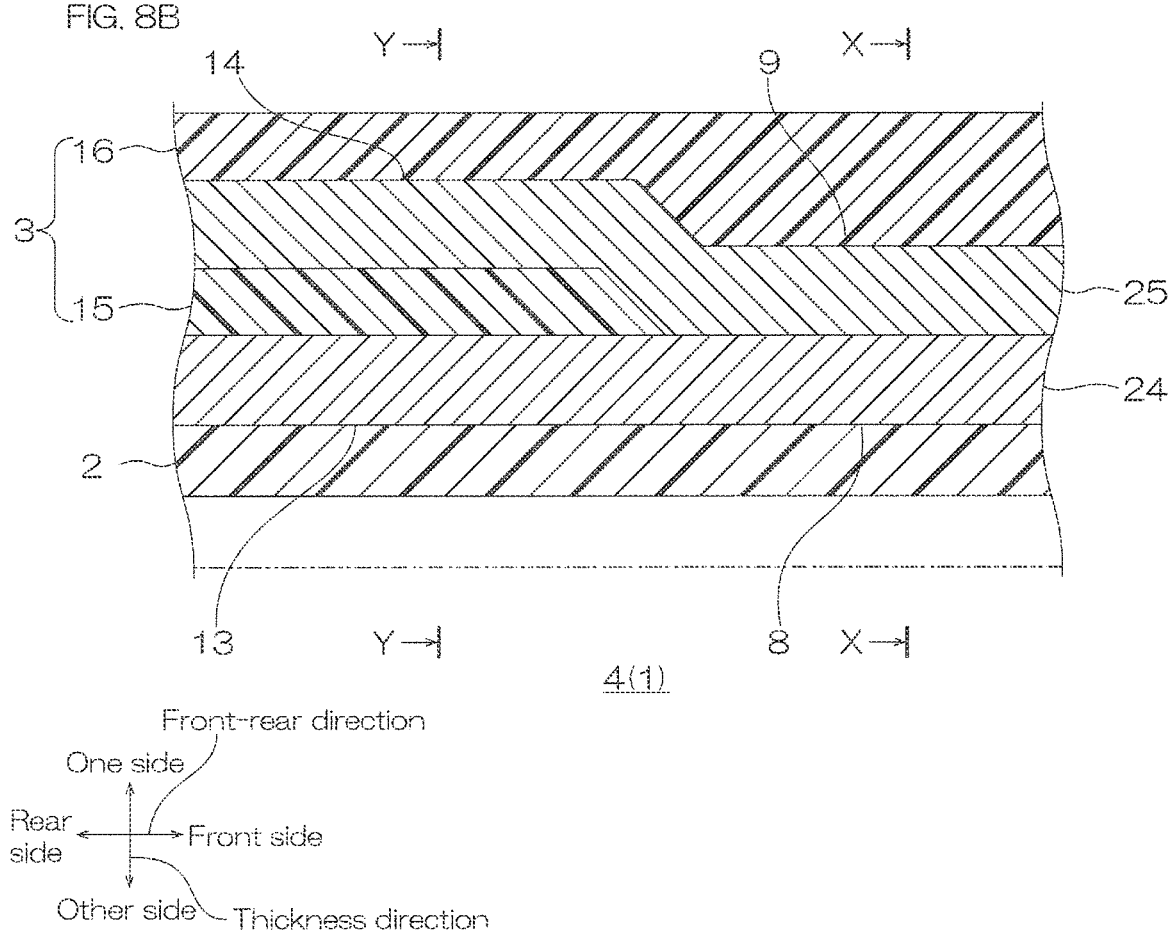

As shown in FIGS. 8A to 8B, the wiring circuit board 1 includes the first pattern portion 4 without including the second pattern portion 5.

The first pattern portion 4 includes a front-side region 21 and a rear-side region 22 in order toward the rear side.

A front cross-section of the front-side region 21 is a cut surface along an X-X line of FIGS. 8A to 8B, and is the same as the left-side view of FIG. 1B. As shown by the left-side view of FIG. 1B, the first pattern portion 4 includes the base insulating layer 2, the first wiring portion 8, the second wiring portion 9, and the second cover insulating layer 16 in the front-side region 21.

A front cross-section of the rear-side region 22 is a cut surface along a Y-Y line of FIGS. 8A to 8B, and is the same as the right-side view of FIG. 1B. As shown by the right-side view of FIG. 1B, the first pattern portion 4 includes the base insulating layer 2, the third wiring portion 13, the first cover insulating layer 15, the fourth wiring portion 14, and the second cover insulating layer 16 in the rear-side region 22.

As shown in FIG. 8B, the first pattern portion 4 includes a fourth wiring layer 24 of one layer including the first wiring portion 8 and the third wiring portion 13, and a fifth wiring layer 25 including the second wiring portion 9 and the fourth wiring portion 14. Since the first wiring portion 8 and the second wiring portion 9 are in contact with each other in the thickness direction in the front-side region 21, the fourth wiring layer 24 and the fifth wiring layer 25 are electrically connected to each other.

Also, in the wiring circuit board 1, as shown by the left-side view of FIG. 1B, in the front-side region 21, it is possible to suppress the peeling of the cover insulating layer 3 from the first wiring portion 8 and the second wiring portion 9 by the two one-side steps 17 and the two other-side steps 18 described above.

As shown by a phantom line of FIG. 3E, the wiring circuit board 1 may further include a metal support layer 29. The metal support layer 29 is in contact with the other surface in the thickness direction of the base insulating layer 2.

Further, another modified example of the method for producing a wiring circuit board of the present invention is described with reference to FIGS. 9A to 9E.

In the producing method of one embodiment, as shown in FIG. 3D, the second wiring portion 9 is formed simultaneously with the fourth wiring portion 14. Alternatively, for example, in the modified example, as shown in FIG. 9B, the second wiring portion 9 is formed simultaneously with the third wiring portion 13.

Figure 9A:
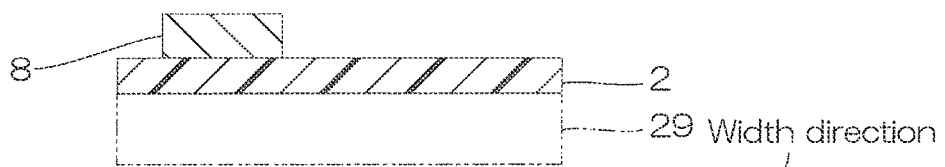
FIGS. 9A to 9E show cross-sectional views of process views for illustrating another method for producing a wiring circuit board.

In the modified example, first, as shown in FIG. 9A, the base insulating layer 2 is prepared. Subsequently, only the first wiring portion 8 is formed.

Figure 9B:
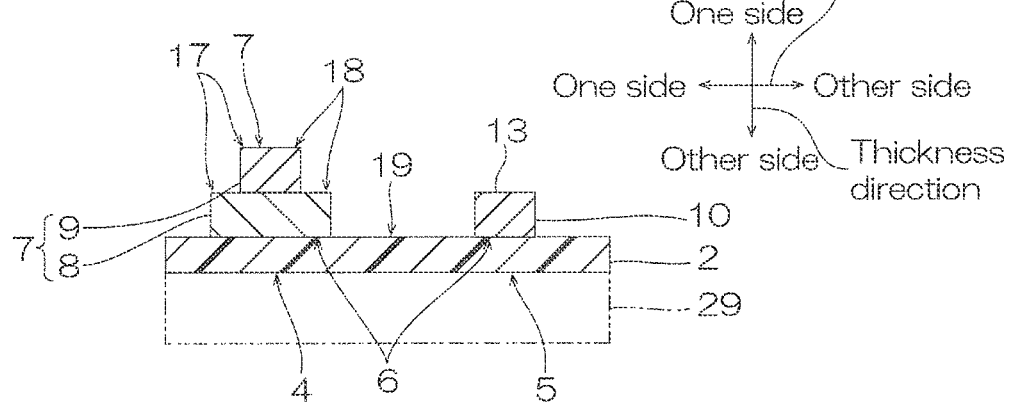

Next, as shown in FIG. 9B, the second wiring portion 9 and the third wiring portion 13 are simultaneously formed.

Figure 9C:
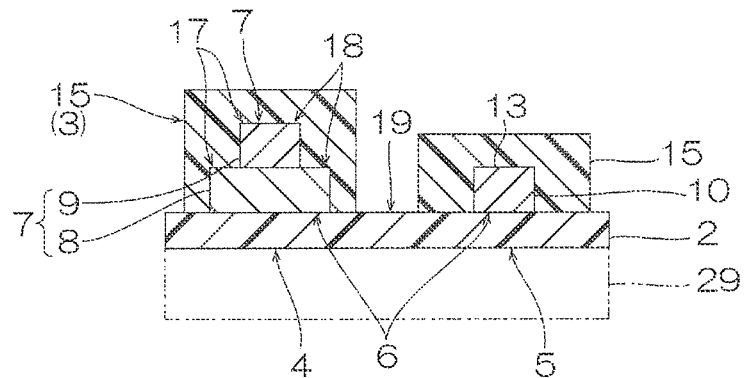

Next, as shown in FIG. 9C, the first cover insulating layer 15 is formed so as to cover the second wiring portion 9 and the third wiring portion 13.

Figure 9D:
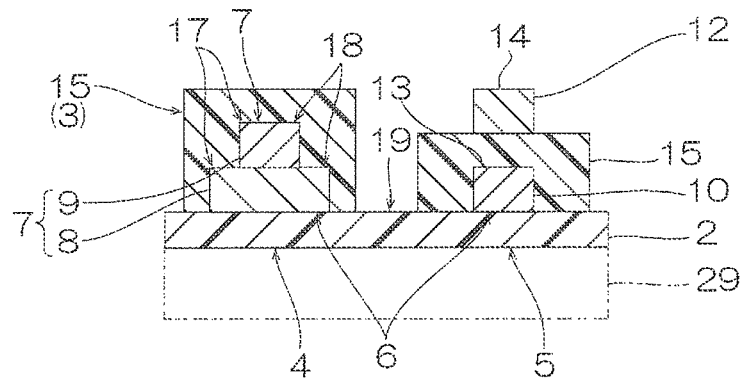

Then, as shown in FIG. 9D, only the fourth wiring portion 14 is formed.

Figure 9E:
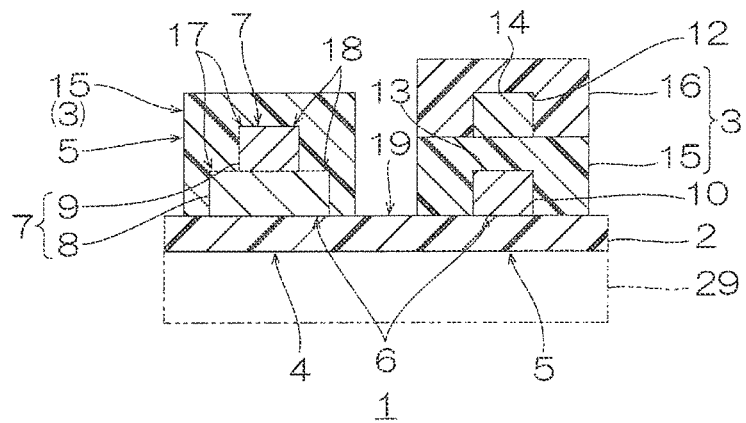

Thereafter, as shown in FIG. 9E, the second cover insulating layer 16 is formed so as to cover only the fourth wiring portion 14.

In the first pattern portion 4 of the wiring circuit board 1 obtained by this method, the cover insulating layer 3 includes the first cover insulating layer 15.

Of the producing method of the modified example and the producing method of one embodiment, the producing method of one embodiment is preferable.

In the producing method of one embodiment, as shown in FIG. 3B, the first wiring portion 8 and the third wiring portion 13 are formed at one time. Further, as shown in FIG. 3D, the second wiring portion 9 and the fourth wiring portion 14 are formed at one time. Therefore, it is possible to form the wiring layer 6 by the two steps (ref: FIGS. 3B and 3D).

In contrast, in the above-described modified example, in the step of FIG. 9A, the first wiring portion 8 is formed; in the step of FIG. 9B, the second wiring portion 9 is formed; and in the step of FIG. 9D, the fourth wiring portion 14 is formed. Therefore, the wiring layer 6 is formed by the three steps, that is, by a larger number of steps than one embodiment.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is used for various electronic applications.

DESCRIPTION OF REFERENCE NUMERALS

1 Wiring circuit board
2 Base insulating layer
3 Cover insulating layer
4 First pattern portion
5 Second pattern portion
6 Wiring layer
7 First wiring layer
8 First wiring portion
9 Second wiring portion
10 Second wiring layer
12 Third wiring layer
13 Third wiring portion
14 Fourth wiring portion

The invention claimed is:

1. A wiring circuit board comprising:
a base insulating layer, a wiring layer disposed at a one-side surface of the base insulating layer in a thickness direction, and a cover insulating layer made of an insulating resin and disposed on the one-side surface of the base insulating layer in the thickness direction of the base insulating layer so as to cover the wiring layer,
wherein the wiring layer includes:
a first wiring portion having a first surface in contact with the one-side surface of the base insulating layer, and a second surface opposite to the first surface in a thickness direction of the first wiring portion, and
a second wiring portion in contact with the second surface of the first wiring portion,
both end surfaces in a width direction perpendicular to the thickness direction and a transmission direction of the second wiring portion, wherein both the end surfaces are disposed within both end surfaces of the first wiring portion in the width direction, and
a step formed from the first wiring portion and the second wiring portion in each of both end portions in the width direction of the wiring portion,
a third wiring portion in contact with the one-side surface of the base insulating layer in the thickness direction, and
a fourth wiring portion spaced apart from the third wiring portion in the thickness direction from the third wiring portion, and
wherein the cover insulating layer covers the step.

2. The wiring circuit board according to claim 1, wherein a ratio (T2/T1) of a thickness T2 of the second wiring portion to a thickness T1 of the first wiring portion is 0.7 or more and 3.0 or less.

3. The wiring circuit board according to claim 1, wherein the wiring layer includes:
a first pattern portion including the first wiring portion and the second wiring portion, and
a second pattern portion including the third wiring portion and the fourth wiring portion, and independent of the first pattern portion.

4. The wiring circuit board according to claim 2, wherein the wiring layer includes:
 a first pattern portion including the first wiring portion and the second wiring portion, and
 a second pattern portion including the third wiring portion and the fourth wiring portion, and independent of the first pattern portion.

5. A method for producing the wiring circuit board according to claim 3, the method comprising:
 forming a base insulating layer,
 forming a first wiring portion and a third wiring portion,
 simultaneously forming a second wiring portion and a fourth wiring portion, and
 forming a cover insulating layer.

6. A method for producing the wiring circuit board according to claim 4, the method comprising:
 forming a base insulating layer,
 forming a first wiring portion and a third wiring portion,
 simultaneously forming a second wiring portion and a fourth wiring portion, and forming a cover insulating layer.

7. The wiring circuit board according to claim 1, wherein a width of the third wiring portion is a same as a width of the second wiring portion.

8. The wiring circuit board according to claim 2, wherein a width of the third wiring portion is a same as a width of the second wiring portion.

9. The wiring circuit board according to claim 7, wherein a width of the fourth wiring portion is a same as a width of the third wiring portion.

10. The wiring circuit board according to claim 8, wherein a width of the fourth wiring portion is a same as a width of the third wiring portion.

* * * * *